United States Patent
Sorenson et al.

(10) Patent No.: US 10,175,307 B1
(45) Date of Patent: Jan. 8, 2019

(54) FM DEMODULATION SYSTEM FOR QUARTZ MEMS MAGNETOMETER

(71) Applicant: HRL Laboratories, LLC, Malibu, CA (US)

(72) Inventors: Logan D. Sorenson, Calabasas, CA (US); Hung Nguyen, Los Angeles, CA (US); Raviv Perahia, Calabasas, CA (US); David T. Chang, Calabasas, CA (US); L. X. Coco Huang, Tarzana, CA (US); Joshua A. Erbland, Brockport, NY (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/997,203

(22) Filed: Jan. 15, 2016

(51) Int. Cl.
*G01R 33/028* (2006.01)
*G01R 33/00* (2006.01)

(52) U.S. Cl.
CPC ..... *G01R 33/0286* (2013.01); *G01R 33/0041* (2013.01)

(58) Field of Classification Search
CPC ................................................ G01R 33/0286
See application file for complete search history.

(56) References Cited

U.S. PATENT DOCUMENTS

| | | |
|---|---|---|
| 392,650 A | 11/1888 | Watrous |
| 2,487,165 A | 11/1949 | Miller |
| 3,390,287 A | 6/1968 | Sonderegger |
| 3,766,616 A | 10/1973 | Staudte |
| 4,364,016 A | 12/1982 | Tanski |
| 4,426,769 A | 1/1984 | Grabbe |
| 4,442,574 A | 4/1984 | Wanuga |
| 4,447,753 A | 5/1984 | Ochiai |
| 4,618,262 A | 10/1986 | Maydan |
| 4,870,313 A | 9/1989 | Hirama et al. |
| 4,898,031 A | 2/1990 | Oikawa et al. |

(Continued)

FOREIGN PATENT DOCUMENTS

| | | |
|---|---|---|
| DE | 44 42 033 | 5/1996 |
| DE | 19719601 | 11/1998 |

(Continued)

OTHER PUBLICATIONS

U.S. Appl. No. 12/179,579, filed Jul. 24, 2008, Kubena.

(Continued)

*Primary Examiner* — Noam Reisner
(74) *Attorney, Agent, or Firm* — Ladas & Parry

(57) ABSTRACT

A magnetometer system has a magnetometer, an interface circuit and an electronic demodulator, the interface circuit being coupled to sense electrodes disposed on the magnetometer and the demodulator being coupled to the interface circuit. Preferably, the magnetometer has a loop electrode which follows an outline of the shape of an active portion of the magnetometer and wherein the electronic demodulator has an output for driving the loop electrode of the magnetometer. Preferably, the magnetometer includes a quartz plate with flexural and thickness shear vibratory modes and wherein the flexural vibratory mode is driven, in use, into vibration by the electronic demodulator and wherein the thickness shear vibratory mode is driven, in use, into vibration by the interface circuit.

32 Claims, 10 Drawing Sheets

(56) References Cited

U.S. PATENT DOCUMENTS

| | | | |
|---|---|---|---|
| 4,944,836 | A | 7/1990 | Beyer et al. |
| 5,203,208 | A | 4/1993 | Bernstein |
| 5,226,321 | A | 7/1993 | Varnham |
| 5,260,596 | A | 11/1993 | Dunn et al. |
| 5,421,312 | A | 6/1995 | Dawson |
| 5,445,008 | A | 8/1995 | Wachter |
| 5,480,747 | A | 1/1996 | Vasudev |
| 5,530,408 | A | 6/1996 | Vig et al. |
| 5,552,016 | A | 9/1996 | Ghanayem |
| 5,578,976 | A | 11/1996 | Yao et al. |
| 5,589,724 | A | 12/1996 | Satoh et al. |
| 5,604,312 | A | 2/1997 | Lutz |
| 5,605,490 | A | 2/1997 | Laffey et al. |
| 5,644,139 | A | 7/1997 | Allen |
| 5,646,346 | A | 7/1997 | Okada |
| 5,648,849 | A | 7/1997 | Canteloup |
| 5,658,418 | A | 8/1997 | Coronel |
| 5,665,915 | A | 9/1997 | Kobayashi |
| 5,666,706 | A | 9/1997 | Tomita et al. |
| 5,668,057 | A | 9/1997 | Eda et al. |
| 5,719,324 | A | 2/1998 | Thundat |
| 5,728,936 | A | 3/1998 | Lutz |
| 5,783,749 | A | 7/1998 | Lee et al. |
| 5,894,090 | A | 4/1999 | Tang et al. |
| 5,905,202 | A | 5/1999 | Kubena et al. |
| 5,920,012 | A | 7/1999 | Pinson |
| 5,928,532 | A | 7/1999 | Koshimizu |
| 5,942,445 | A | 8/1999 | Kato et al. |
| 5,959,206 | A | 9/1999 | Ryrko |
| 5,981,392 | A | 11/1999 | Oishi |
| 5,987,985 | A | 11/1999 | Okada |
| 6,009,751 | A | 1/2000 | Ljung |
| 6,033,852 | A | 3/2000 | Andle |
| 6,044,705 | A | 4/2000 | Neukermans |
| 6,049,702 | A | 4/2000 | Tham et al. |
| 6,081,334 | A | 6/2000 | Grimbergen |
| 6,089,088 | A | 7/2000 | Charvet |
| 6,094,985 | A | 8/2000 | Kapels et al. |
| 6,114,801 | A | 9/2000 | Tanaka et al. |
| 6,145,380 | A | 11/2000 | MacGugan |
| 6,151,964 | A | 11/2000 | Nakajima |
| 6,155,115 | A | 12/2000 | Ljung |
| 6,164,134 | A | 12/2000 | Cargille |
| 6,182,352 | B1 | 2/2001 | Deschenes |
| 6,196,059 | B1 | 3/2001 | Koesslinger |
| 6,204,737 | B1 | 3/2001 | Ella |
| 6,207,008 | B1 | 3/2001 | Kijima |
| 6,236,145 | B1 | 5/2001 | Biernacki |
| 6,250,157 | B1 | 6/2001 | Touge |
| 6,263,552 | B1 | 7/2001 | Takeuchi |
| 6,282,958 | B1 | 9/2001 | Fell et al. |
| 6,289,733 | B1 | 9/2001 | Challoner |
| 6,297,064 | B1 | 10/2001 | Koshimizu |
| 6,335,667 | B1 | 1/2002 | Takagi |
| 6,336,366 | B1 | 1/2002 | Thundat |
| 6,349,597 | B1 | 2/2002 | Folkmer |
| 6,367,326 | B1 | 4/2002 | Okada |
| 6,367,786 | B1 | 4/2002 | Gutierrez |
| 6,413,682 | B1 | 7/2002 | Shibano |
| 6,417,925 | B1 | 7/2002 | Naya |
| 6,424,418 | B2 | 7/2002 | Kawabata |
| 6,426,296 | B1 | 7/2002 | Okojie |
| 6,429,652 | B1 | 8/2002 | Allen |
| 6,432,824 | B2 | 8/2002 | Yanagisawa |
| 6,481,284 | B2 | 11/2002 | Geen et al. |
| 6,481,285 | B1 | 11/2002 | Shkel et al. |
| 6,492,195 | B2 | 12/2002 | Nakanishi |
| 6,513,380 | B2 | 2/2003 | Reeds et al. |
| 6,514,767 | B1 | 2/2003 | Natan |
| 6,515,278 | B2 | 2/2003 | Wine et al. |
| 6,571,629 | B1 | 6/2003 | Kipp |
| 6,584,845 | B1 | 7/2003 | Gutierrez |
| 6,614,529 | B1 | 9/2003 | Tang |
| 6,621,158 | B2 | 9/2003 | Martin et al. |
| 6,627,067 | B1 | 9/2003 | Branton |
| 6,628,177 | B2 | 9/2003 | Clark et al. |
| 6,629,460 | B2 | 10/2003 | Challoner |
| 6,651,027 | B2 | 11/2003 | McCall |
| 6,686,807 | B1 | 2/2004 | Giousouf |
| 6,710,681 | B2 | 3/2004 | Figueredo |
| 6,713,938 | B2 | 3/2004 | Nguyen |
| 6,715,352 | B2 | 4/2004 | Tracy |
| 6,744,335 | B2 | 6/2004 | Ryhanen |
| 6,750,728 | B2 | 6/2004 | Takahashi |
| 6,756,304 | B1 | 6/2004 | Robert |
| 6,768,396 | B2 | 7/2004 | Klee et al. |
| 6,796,179 | B2 | 9/2004 | Bae et al. |
| 6,806,557 | B2 | 10/2004 | Ding |
| 6,815,228 | B2 | 11/2004 | Usui et al. |
| 6,856,217 | B1 | 2/2005 | Clark et al. |
| 6,862,398 | B2 | 3/2005 | Elkind et al. |
| 6,883,374 | B2 | 4/2005 | Fell et al. |
| 6,909,221 | B2 | 6/2005 | Ayazi et al. |
| 6,915,215 | B2 | 7/2005 | M'Closkey |
| 6,933,164 | B2 | 8/2005 | Kubena |
| 6,943,484 | B2 | 9/2005 | Clark et al. |
| 6,944,931 | B2 | 9/2005 | Shcheglov |
| 6,953,977 | B2 | 10/2005 | Mlcak |
| 6,954,020 | B2 | 10/2005 | Ma et al. |
| 6,984,925 | B2 | 1/2006 | Morley |
| 6,985,051 | B2 | 1/2006 | Nguyen et al. |
| 7,002,281 | B2 | 2/2006 | Andle |
| 7,040,163 | B2 | 5/2006 | Shcheglov |
| 7,057,331 | B2 | 6/2006 | Shimodaira |
| 7,118,657 | B2 | 10/2006 | Golovchenko |
| 7,152,290 | B2 | 12/2006 | Junhua et al. |
| 7,168,318 | B2 | 1/2007 | Challoner |
| 7,211,933 | B2 | 5/2007 | Kawakubo |
| 7,224,245 | B2 | 5/2007 | Song et al. |
| 7,232,700 | B1 | 6/2007 | Kubena |
| 7,234,214 | B2 | 6/2007 | Xu |
| 7,237,315 | B2 | 7/2007 | Kubena |
| 7,295,088 | B2 | 11/2007 | Nguyen |
| 7,298,067 | B1 * | 11/2007 | Kosinski ............... H03H 9/1014 310/313 R |
| 7,317,354 | B2 | 1/2008 | Lee |
| 7,347,095 | B2 | 3/2008 | Shcheglov |
| 7,401,397 | B2 | 7/2008 | Shcheglov |
| 7,409,851 | B2 | 8/2008 | Ilic et al. |
| 7,446,628 | B2 | 11/2008 | Morris, III |
| 7,459,099 | B2 | 12/2008 | Kubena et al. |
| 7,459,992 | B2 | 12/2008 | Matsuda |
| 7,479,846 | B2 | 1/2009 | Inoue et al. |
| 7,490,390 | B2 | 2/2009 | Kawakubo |
| 7,493,814 | B2 | 2/2009 | Whelan et al. |
| 7,543,496 | B2 | 6/2009 | Ayazi |
| 7,551,054 | B2 | 6/2009 | Mizuno et al. |
| 7,555,824 | B2 | 7/2009 | Chang |
| 7,555,938 | B2 | 7/2009 | Bargatin et al. |
| 7,557,493 | B2 | 7/2009 | Fujimoto |
| 7,559,130 | B2 | 7/2009 | Kubena et al. |
| 7,564,177 | B2 | 7/2009 | Yoshimatsu |
| 7,579,748 | B2 | 8/2009 | Kuroda |
| 7,579,926 | B2 | 8/2009 | Jhung |
| 7,581,443 | B2 | 9/2009 | Kubena |
| 7,624,494 | B2 | 12/2009 | Challoner |
| 7,663,196 | B2 | 2/2010 | Liu et al. |
| 7,671,427 | B2 | 3/2010 | Kim et al. |
| 7,675,224 | B2 | 3/2010 | Tanaya |
| 7,690,095 | B2 | 4/2010 | Takahashi |
| 7,750,535 | B2 | 7/2010 | Kubena |
| 7,757,393 | B2 | 7/2010 | Ayazi et al. |
| 7,791,431 | B2 | 9/2010 | Han |
| 7,791,432 | B2 | 9/2010 | Piazza et al. |
| 7,793,541 | B2 | 9/2010 | Challoner |
| 7,802,356 | B1 | 9/2010 | Chang |
| 7,830,074 | B2 | 11/2010 | Kubena |
| 7,836,765 | B2 | 11/2010 | Challoner |
| 7,872,548 | B2 | 1/2011 | Nishihara |
| 7,884,930 | B2 | 2/2011 | Kirby |
| 7,895,892 | B2 | 3/2011 | Aigner |
| 7,958,781 | B2 | 6/2011 | Fell |
| 7,987,714 | B2 | 8/2011 | DeNatale |
| 7,994,877 | B1 | 8/2011 | Kubena |

(56) References Cited

U.S. PATENT DOCUMENTS

| | | |
|---|---|---|
| 8,138,016 B2 | 3/2012 | Chang |
| 8,151,640 B1 | 4/2012 | Kubena |
| 8,176,607 B1 | 5/2012 | Kubena |
| 8,205,495 B2 | 6/2012 | Challoner |
| 8,322,028 B2 | 12/2012 | Ge et al. |
| 8,381,590 B2 | 2/2013 | Ikeda et al. |
| 8,393,212 B2 | 3/2013 | Ge et al. |
| 8,402,824 B1 | 3/2013 | Kubena |
| 8,522,612 B1 | 9/2013 | Kubena |
| 8,569,937 B1 | 10/2013 | Kubena |
| 8,593,037 B1 | 11/2013 | Kubena |
| 8,766,745 B1 | 7/2014 | Kubena |
| 8,769,802 B1 | 7/2014 | Chang |
| 8,782,876 B1 | 7/2014 | Kubena |
| 8,912,711 B1 | 12/2014 | Chang |
| 8,933,759 B1 | 1/2015 | Kubena |
| 9,046,541 B1 | 6/2015 | Kubena |
| 9,061,886 B1 | 6/2015 | Nguyen |
| 2002/0066317 A1 | 6/2002 | Lin |
| 2002/0072246 A1 | 6/2002 | Goo et al. |
| 2002/0074947 A1 | 6/2002 | Tsukamoto |
| 2002/0107658 A1 | 8/2002 | McCall |
| 2002/0185611 A1 | 12/2002 | Menapace |
| 2003/0003608 A1 | 1/2003 | Arikado |
| 2003/0010123 A1 | 1/2003 | Malvern |
| 2003/0029238 A1 | 2/2003 | Challoner |
| 2003/0196490 A1 | 10/2003 | Cardarelli |
| 2003/0205948 A1 | 11/2003 | Lin et al. |
| 2004/0055380 A1 | 3/2004 | Shcheglov |
| 2004/0055381 A1 | 3/2004 | Shcheglov |
| 2004/0065864 A1 | 4/2004 | Vogt et al. |
| 2004/0189311 A1 | 9/2004 | Glezer |
| 2004/0211052 A1 | 10/2004 | Kubena et al. |
| 2005/0024165 A1 | 2/2005 | Hsu |
| 2005/0034822 A1 | 2/2005 | Kim et al. |
| 2005/0056917 A1 | 3/2005 | Kwon |
| 2005/0062368 A1 | 3/2005 | Hirasawa |
| 2005/0093659 A1 | 5/2005 | Larson et al. |
| 2005/0156309 A1 | 7/2005 | Fujii |
| 2005/0172714 A1 | 8/2005 | Challoner |
| 2005/0260792 A1 | 11/2005 | Patel |
| 2005/0274183 A1 | 12/2005 | Shcheglov |
| 2006/0016065 A1 | 1/2006 | Nagaura |
| 2006/0022556 A1 | 2/2006 | Bail et al. |
| 2006/0055479 A1 | 3/2006 | Okazaki |
| 2006/0066419 A1 | 3/2006 | Iwaki |
| 2006/0162146 A1 | 7/2006 | Shcheglov |
| 2006/0197619 A1 | 9/2006 | Oishi et al. |
| 2006/0213266 A1 | 9/2006 | French |
| 2006/0252906 A1 | 11/2006 | Godschalx |
| 2006/0255691 A1 | 11/2006 | Kuroda |
| 2007/0017287 A1 | 1/2007 | Kubena |
| 2007/0034005 A1 | 2/2007 | Acar |
| 2007/0069605 A1 | 3/2007 | Klaasse et al. |
| 2007/0084042 A1 | 4/2007 | Challoner |
| 2007/0205839 A1 | 9/2007 | Kubena et al. |
| 2007/0220971 A1 | 9/2007 | Ayazi |
| 2007/0240508 A1 | 10/2007 | Watson |
| 2008/0034575 A1 | 2/2008 | Chang et al. |
| 2008/0074661 A1 | 3/2008 | Zhang et al. |
| 2008/0096313 A1 | 4/2008 | Patel |
| 2008/0100176 A1* | 5/2008 | Haskell ............ G01H 11/08 310/313 R |
| 2008/0148846 A1 | 6/2008 | Whelan |
| 2008/0295622 A1 | 12/2008 | Challoner |
| 2009/0095077 A1 | 4/2009 | DeNatale |
| 2009/0140356 A1 | 6/2009 | Yazdi |
| 2009/0146527 A1 | 6/2009 | Lee et al. |
| 2009/0189294 A1 | 7/2009 | Chang |
| 2010/0020311 A1 | 1/2010 | Kirby |
| 2010/0024560 A1 | 2/2010 | Shcheglov |
| 2010/0148803 A1 | 6/2010 | Ohnishi |
| 2010/0251817 A1 | 10/2010 | Ge et al. |
| 2010/0251818 A1 | 10/2010 | Ge et al. |
| 2011/0107838 A1 | 5/2011 | Suijlen |
| 2012/0000288 A1 | 1/2012 | Matsuura |
| 2012/0212109 A1 | 8/2012 | Yamazaki |
| 2012/0266682 A1 | 10/2012 | Torashima |
| 2012/0306321 A1 | 12/2012 | Ishii |
| 2013/0313947 A1 | 11/2013 | Chen |
| 2014/0049256 A1* | 2/2014 | Smith ............ G01R 33/0286 324/259 |
| 2015/0188030 A1 | 7/2015 | Andosca |
| 2016/0079884 A1 | 3/2016 | Lange |

FOREIGN PATENT DOCUMENTS

| | | |
|---|---|---|
| EP | 0 461 761 | 12/1991 |
| EP | 0 531 985 | 3/1993 |
| EP | 1055908 | 11/2000 |
| EP | 0 971 208 | 12/2000 |
| JP | 57-091017 | 6/1982 |
| JP | 401129517 | 5/1989 |
| JP | 04322507 | 11/1992 |
| JP | 5286142 | 11/1993 |
| JP | 06232678 | 8/1994 |
| JP | 6-318533 | 11/1994 |
| JP | 08330878 | 12/1996 |
| JP | 9-247025 | 9/1997 |
| JP | 2003-318685 | 11/2003 |
| JP | 2005-180921 | 7/2005 |
| JP | 2006-352487 | 12/2006 |
| KR | 10-2001-0110428 | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

U.S. Appl. No. 12/026,486, filed Feb. 5, 2008, Kubena.

Aaltonen, T. et al., "ALD of Rhodium thin films from Rh (acac) 3 and Oxygen" Electrochemical and Solid State Letters, 8, C99-101 (2005).

Abe, T., et al., "One-chip Multichannel Quartz Crystal Microbalance (QCM) Fabricated by Deep RIE," Sensors and Actuators, 82 (2000), pp. 139-143.

Antonio, D. et al., "Micromechanical magnetometer using an all-silicon nonlinear torsional resonator," Applied Physics Letters 95, 133505 2009 (4 pages).

Bahreyni, Behraad, et al.,"A Resonant Micromachined Magnetic Field Sensor," IEEE Sensors Journal, vol. 7, No. 9, Sep. 2007, pp. 1326 to 1334.

Barbour et al., "Micromechanical Silicon Instrument and Systems Development at Draper Laboratory," AIAA Guidance Navigation and Control Conference, 1996, Paper No. 96-3709.

Burdess et al., "The Theory of a Piezoelectric Disc Gyroscope", Jul. 1986, IEEE Transactions and Aerospace and Electronic Systems, vol. AES 22, No. 4; p. 410-418.

Cleland, A.N. et al., "Fabrication of High Frequency Nanometer Scale Mechanical Resonators From Bulk Si Crystals," Applied Physics Letters, Oct. 28, 1996, pp. 2653-2655.

Evoy, S., et al. "Temperature-dependent Internal Friction in Silicon Nanoelectromechanical Systems," Applied Physics Letters, vol. 77, No. 15, Oct. 9, 2000, pp. 2397-2399.

Friedt, J-M., et al., "Introduction to the quartz tuning fork" , American Journal of Physics 75, 415 (2007), pp. 415-422.

Fujita et al., "Disk-shaped bulk micromachined gyroscope with vacuum sealing," Sensors and Actuators 82, May 2000, pp. 198-204.

Greer, J.A., et al., "Properties of SAW resonators fabricated on quartz substrates of various qualities" Ultrasonics Symposium, 1994 IEEE, vol. 1, Nov. 1-4, 1994, pp. 31-36.

(56) References Cited

OTHER PUBLICATIONS

Herrera-May, A L, et al. "A resonant magnetic field microsensor with high quality factor at atmospheric pressure," J. Micromechanics Microengineering, 19 (2009) 015016 (11pp).
Johnson et al., "Surface Micromachined Angular Rate Sensor," 1995 SAE Conference, Paper No. 950538, pp. 77-83.
Lin, J.W., et al., "A Robust High-Q Micromachined RF Inductor for RFIC Applications," IEEE Transactions on Electronic Devices, vol. 52, No. 7, pp. 1489-1496 (Jul. 2005).
Nguyen, Hung D., et al., "UHF Piezoelectric Quartz MEMS Magnetometers Based on Acoustic Coupling of Flexural and Thickness Shear Modes," MEMS 2015, Estoril, Portugal, Jan. 18-22, 2015, pp. 944-947.
Park, K.J. et al., "Selective area atomic layer deposition of rhodium and effective work function characterization in capacitor structures," Applied Physics Letters 89, 043111 (2006), 3 pages.
Putty et al., "A Micromachined Vibrating Ring Gyroscope," Solid State Sensor and Actuator Workshop, Transducer Research Foundation, Hilton Head, South Carolina, 1994, pp. 213-220.
Sirbuly, Donald J. et al., Multifunctional Nanowire Evanescent Wave Optical Sensors, Advanced Materials, 2007 (published online: Dec. 5, 2006), 19, pp. 61-66.
Skulski et al., "Planar resonator sensor for moisture measurements", Microwaves and Radar, 1998, MIKON '98, 12th International Conf., vol. 3, May 20-22, 1998, pp. 692-695.
Sunier, R., et al., "Resonant Magnetic Field Sensor With Frequency Output," Journal of Microelectromechanical Systems, vol. 15, No. 5, pp. 1098-1107, Oct. 2006.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab, Jun. 2, 1996 (6 pages).
Thompson, M.J. "Low Power 3-axis Lorentz Force Navigation Magnetometer,", MEMS 2011, Cancun, Mexico, Jan. 23-27, 2011.
White, Lan M., et al., Increasing the Enhancement of SERS with Dielectric Microsphere Resonators, Spectroscopy-Eugene, Apr. 2006 (5 pages).
Wickenden, Dennis, et al. "Development of Miniature Magnetometers," Johns Hopkins APL Technical Digest, vol. 18, No. 2 (1997), pp. 271-278.
Wright, et al., "The HRG Applied to a Satellite Attitude Reference System," Guidance and Control, AASAAS, 1994, 86: pp. 55-67.
Yan, Fei, et al., "Surface-enhanced Raman scattering (SERS) detection for chemical and biological agents," IEEE Sensors Journal, vol. 5, No. 4, Aug. 2005 (7 pages).
From U.S. Appl. No. 11/818,797 (now published as 2010/0020311), Application and Office Actions.
From U.S. Appl. No. 10/426,931 (now U.S. Pat. No. 7,237,315), Notice of Allowance dated Feb. 1, 2007
From U.S. Appl. No. 10/426,931 (now U.S. Pat. No. 7,237,315), Office Action dated Oct. 24, 2006.
From U.S. Appl. No. 10/426,931 (now U.S. Pat. No. 7,237,315), Office Action dated Sep. 13, 2006.
From U.S. Appl. No. 10/426,931 (now U.S. Pat. No. 7,237,315), Office Action dated Jul. 11, 2006.
From U.S. Appl. No. 10/426,931 (now U.S. Pat. No. 7,237,315), Office Action dated Jan. 20, 2006.
From U.S. Appl. No. 10/426,931 (now U.S. Pat. No. 7,237,315), Office Action dated Aug. 11, 2005.
From U.S. Appl. No. 10/426,931 (now U.S. Pat. No. 7,237,315), Office Action dated May 16, 2005.
From U.S. Appl. No. 10/426,931 (now U.S. Pat. No. 7,237,315), Office Action dated Dec. 8, 2004.
From U.S. Appl. No. 10/426,931 (now U.S. Pat. No. 7,237,315), Office Action dated Aug. 31, 2004.
From U.S. Appl. No. 10/426,931 (now U.S. Pat. No. 7,237,315), Office Action dated Jun. 16, 2004.
From U.S. Appl. No. 11/043,378 (now U.S. Pat. No. 7,459,099), Notice of Allowance dated Aug. 4, 2008.
From U.S. Appl. No. 11/043,378 (now U.S. Pat. No. 7,459,099), Office Action dated Jan. 15, 2008.
From U.S. Appl. No. 11/043,378 (now U.S. Pat. No. 7,459,099), Office Action dated Sep. 12, 2007.
From U.S. Appl. No. 11/043,378 (now U.S. Pat. No. 7,459,099), Office Action dated May 25, 2007.
From U.S. Appl. No. 11/043,378 (now U.S. Pat. No. 7,459,099), Office Action dated Dec. 6, 2006.
From U.S. Appl. No. 11/043,378 (now U.S. Pat. No. 7,459,099), Office Action dated Aug. 11, 2006.
From U.S. Appl. No. 11/458,911 (now U.S. Pat. No. 7,581,443), Notice of Allowance dated Apr. 23, 2009.
From U.S. Appl. No. 11/458,911 (now U.S. Pat. No. 7,581,443), Office Action dated Sep. 17, 2008.
From U.S. Appl. No. 11/458,911 (now U.S. Pat. No. 7,581,443), Office Action dated Jul. 2, 2008.
From U.S. Appl. No. 11/458,911 (now U.S. Pat. No. 7,581,443), Office Action dated Apr. 17, 2008.
From U.S. Appl. No. 11/458,911 (now U.S. Pat. No. 7,581,443), Office Action dated Oct. 12, 2007.
From U.S. Appl. No. 11/502,336 (now U.S. Pat. No. 7,555,824), Notice of Allowance dated Mar. 20, 2009.
From U.S. Appl. No. 11/502,336 (now U.S. Pat. No. 7,555,824), Office Action dated Jan. 23, 2009.
From U.S. Appl. No. 11/502,336 (now U.S. Pat. No. 7,555,824), Office Action dated Nov. 14, 2008.
From U.S. Appl. No. 11/800,289 (now U.S. Pat. No. 7,559,130), Notice of Allowance dated Mar. 25, 2009.
From U.S. Appl. No. 11/800,289 (now U.S. Pat. No. 7,559,130), Office Action dated Oct. 24, 2008.
From U.S. Appl. No. 11/800,294 (now U.S. Pat. No. 7,750,535), Notice of Allowance dated Nov. 30, 2009.
From U.S. Appl. No. 11/800,294 (now U.S. Pat. No. 7,750,535), Office Action dated Jul. 29, 2009.
From U.S. Appl. No. 11/881,461 (now U.S. Pat. No. 7,830,074), Notice of Allowance dated Sep. 24, 2010.
From U.S. Appl. No. 11/881,461 (now U.S. Pat. No. 7,830,074), Notice of Allowance dated Jul. 13, 2010.
From U.S. Appl. No. 11/881,461 (now U.S. Pat. No. 7,830,074), Office Action dated Jun. 2, 2010.
From U.S. Appl. No. 11/881,461 (now U.S. Pat. No. 7,830,074), Office Action dated Oct. 19, 2009.
From U.S. Appl. No. 11/881,461 (now U.S. Pat. No. 7,830,074), Office Action dated Jun. 16, 2009.
From U.S. Appl. No. 12/027,247 (now U.S. Pat. No. 8,151,640), Office Action dated Dec. 8, 2011.
From U.S. Appl. No. 12/027,247 (now U.S. Pat. No. 8,151,640), Office Action dated Jun. 7, 2011.
From U.S. Appl. No. 12/027,247 (now U.S. Pat. No. 8,151,640), Office Action dated Feb. 16, 2011.
From U.S. Appl. No. 12/034,852 (now U.S. Pat. No. 7,802,356), Notice of Allowance dated May 19, 2010.
From U.S. Appl. No. 12/034,852 (now U.S. Pat. No. 7,802,356), Office Action dated Jan. 28, 2010.
From U.S. Appl. No. 12/034,852 (now U.S. Pat. No. 7,802,356), Office Action dated Oct. 2, 2009.
From U.S. Appl. No. 12/145,678 (now U.S. Pat. No. 7,884,930), Notice of Allowance dated Jul. 13, 2010.
From U.S. Appl. No. 12/145,678 (now U.S. Pat. No. 7,884,930), Office Action dated Mar. 26, 2010.
From U.S. Appl. No. 12/145,678 (now U.S. Pat. No. 7,884,930), Office Action dated Jan. 14, 2010.
From U.S. Appl. No. 12/145,678 (now U.S. Pat. No. 7,884,930), Office Action dated Jul. 22, 2009.
From U.S. Appl. No. 12/268,309 (now U.S. Pat. No. 7,994,877), Notice of Allowance dated Apr. 4, 2011.
From U.S. Appl. No. 12/268,309 (now U.S. Pat. No. 7,994,877), Office Action dated Nov. 22, 2010.
From U.S. Appl. No. 12/268,309 (now U.S. Pat. No. 7,994,877), Office Action dated Aug. 20, 2010.
From U.S. Appl. No. 12/399,680 (now U.S. Pat. No. 8,138,016), Notice of Allowance dated Nov. 14, 2011.

(56) References Cited

OTHER PUBLICATIONS

From U.S. Appl. No. 12/399,680 (now U.S. Pat. No. 8,138,016), Office Action dated Aug. 4, 2011.
From U.S. Appl. No. 12/399,680 (now U.S. Pat. No. 8,138,016), Office Action dated Jun. 7, 2011.
From U.S. Appl. No. 12/488,784 (now U.S. Pat. No. 8,766,745), Notice of Allowance dated Feb. 20, 2014.
From U.S. Appl. No. 12/488,784 (now U.S. Pat. No. 8,766,745), Office Action dated Oct. 3, 2013.
From U.S. Appl. No. 12/488,784 (now U.S. Pat. No. 8,766,745), Office Action dated Jun. 4, 2013.
From U.S. Appl. No. 12/488,784 (now U.S. Pat. No. 8,766,745), Office Action dated Jan. 3, 2013.
From U.S. Appl. No. 12/488,784 (now U.S. Pat. No. 8,766,745), Office Action dated Aug. 1, 2012.
From U.S. Appl. No. 12/488,784 (now U.S. Pat. No. 8,766,745), Office Action dated Apr. 30, 2012.
From U.S. Appl. No. 12/575,634 (now U.S. Pat. No. 8,176,607), Notice of Allowance dated Jan. 9, 2012.
From U.S. Appl. No. 12/575,634 (now U.S. Pat. No. 8,176,607), Office Action dated Oct. 17, 2011.
From U.S. Appl. No. 12/575,634 (now U.S. Pat. No. 8,176,607), Office Action dated Jul. 11, 2011.
From U.S. Appl. No. 12/575,634 (now U.S. Pat. No. 8,176,607), Office Action dated Mar. 23, 2011.
From U.S. Appl. No. 12/820,761 (now U.S. Pat. No. 8,912,711), Notice of Allowance dated Oct. 30, 2014.
From U.S. Appl. No. 12/820,761 (now U.S. Pat. No. 8,912,711), Notice of Allowance dated Aug. 15, 2014.
From U.S. Appl. No. 12/820,761 (now U.S. Pat. No. 8,912,711), Office Action dated Jul. 1, 2014.
From U.S. Appl. No. 12/820,761 (now U.S. Pat. No. 8,912,711), Office Action dated Mar. 7, 2014.
From U.S. Appl. No. 12/820,761 (now U.S. Pat. No. 8,912,711), Office Action dated Nov. 19, 2013.
From U.S. Appl. No. 12/820,761 (now U.S. Pat. No. 8,912,711), Office Action dated Jul. 24, 2013.
From U.S. Appl. No. 12/820,761 (now U.S. Pat. No. 8,912,711), Office Action dated Mar. 19, 2013.
From U.S. Appl. No. 12/820,761 (now U.S. Pat. No. 8,912,711), Office Action dated Nov. 2, 2012.
From U.S. Appl. No. 12/820,761 (now U.S. Pat. No. 8,912,711), Office Action dated Sep. 6, 2012.
From U.S. Appl. No. 12/820,761 (now U.S. Pat. No. 8,912,711), Office Action dated Jun. 25, 2012.
From U.S. Appl. No. 12/820,761 (now U.S. Pat. No. 8,912,711), Office Action dated Feb. 23, 2012.
From U.S. Appl. No. 12/820,761 (now U.S. Pat. No. 8,912,711), Office Action dated Jan. 9, 2012.
From U.S. Appl. No. 12/831,028 (now U.S. Pat. No. 8,769,802), Notice of Allowance dated Feb. 27, 2014.
From U.S. Appl. No. 12/831,028 (now U.S. Pat. No. 8,769,802), Office Action dated Nov. 7, 2013.
From U.S. Appl. No. 12/831,028 (now U.S. Pat. No. 8,769,802), Office Action dated Apr. 11, 2012.
From U.S. Appl. No. 13/163,357 (now U.S. Pat. No. 8,782,876), Notice of Allowance dated Mar. 13, 2014.
From U.S. Appl. No. 13/163,357 (now U.S. Pat. No. 8,782,876), Office Action dated Aug. 19, 2013.
From U.S. Appl. No. 13/163,357 (now U.S. Pat. No. 8,782,876), Office Action dated Mar. 1, 2013.
From U.S. Appl. No. 13/410,998 (now U.S. Pat. No. 8,522,612), Notice of Allowance dated Apr. 11, 2013.
From U.S. Appl. No. 13/434,144 (now U.S. Pat. No. 8,593,037), Notice of Allowance dated Jul. 11, 2013.
From U.S. Appl. No. 13/648,041 (now U.S. Pat. No. 9,046,541), Notice of Allowance dated Jan. 16, 2015.
From U.S. Appl. No. 13/648,041 (now U.S. Pat. No. 9,046,541), Office Action dated Sep. 15, 2014.
From U.S. Appl. No. 13/840,160 (now U.S. Pat. No. 9,061,886), Notice of Allowance dated Feb. 20, 2015.
From U.S. Appl. No. 13/840,160 (now U.S. Pat. No. 9,061,886), Office Action dated Dec. 16, 2014.
From U.S. Appl. No. 13/840,160 (now U.S. Pat. No. 9,061,886), Office Action dated Jun. 30, 2014.
U.S. Appl. No. 13/363,174, Nguyen, filed Feb. 20, 2015.
U.S. Appl. No. 13/910,039, Gregoire, filed Jun. 4, 2013.
U.S. Appl. No. 14/628,076, White, filed Feb. 20, 2015.
U.S. Appl. No. 14/628,182, Kubena, filed Apr. 7, 2015.
U.S. Appl. No. 14/680,902, Kubena, filed Jan. 31, 2012.
U.S. Appl. No. 14/997,423, Nguyen, filed Jan. 15, 2016.
U.S. Appl. No. 15/083,190, Perahia, filed Mar. 28, 2016.
Younis, Mohammad I., "Multi-Mode Excitation of a Clamped-clamped Microbeam Resonator," Nonlinear Dynamics, vol. 80, No. 3 (2015), pp. 1531-1541.
Zhang, Xuehui; et al., "FPGA-Based Multi-Frequency Excitation and Modulation Technology in EIT System," 2010 3rd International Conference on Biomedical Engineering and Informatics (BMEI 2010), pp. 907-911.
From U.S. Appl. No. 12/026,486, filed Feb. 5, 2008, unpublished, non publication requested, Application.
From U.S. Appl. No. 14/680,902, filed Apr. 7, 2015, unpublished, non publication requested, Application.
From U.S. Appl. No. 14/997,160 (unpublished; non-publication request filed), Office Action dated Apr. 3, 2017.
From U.S. Appl. No. 14/628,182 (unpublished, non publication request filed), Notice of Allowance dated Jan. 23, 2018.
From U.S. Appl. No. 14/628,182 (unpublished, non publication request filed), office action dated Nov. 9, 2017.
From U.S. Appl. No. 14/628,182 (unpublished, non publication request filed), office action dated May 31, 2017.
From U.S. Appl. No. 14/628,182 (unpublished, non publication request filed), office action dated Mar. 20, 2017.
From U.S. Appl. No. 14/628,182 (unpublished, non publication request filed), office action dated Dec. 9, 2016.
From U.S. Appl. No. 14/628,182 (unpublished, non publication request filed), office action dated Jun. 29, 2016.
From U.S. Appl. No. 14/997,423 (unpublished, non publication request filed), Notice of Allowance dated Mar. 29, 2018.
From U.S. Appl. No. 14/997,423 (unpublished, non publication request filed), office action dated Nov. 1, 2017.
From U.S. Appl. No. 14/997,423 (unpublished, non publication request filed), office action dated Apr. 13, 2017.

* cited by examiner

FM DEMODULATION SYSTEM FOR QUARTZ MEMS MAGNETOMETER

CROSS REFERENCE TO RELATED APPLICATIONS

This Application is related to U.S. Provisional Patent Application Ser. No. 61/943,213 filed 21 Feb. 2014 and entitled "A Micro-Scale Piezoelectric Resonating Magnetometer" and to U.S. patent application Ser. No. 14/628,182 filed 20 Feb. 2015 and entitled "A Micro-Scale Piezoelectric Resonating Magnetometer". The disclosure of these two applications are also hereby incorporated herein by reference.

This Application is also related to U.S. patent application Ser. No. 14/997,423 filed on the same date as this application and entitled A Piezoelectric Magnetometer Capable of Sensing a Magnetic Field in Multiple Vectors", the disclosure of which is hereby incorporated herein by reference.

This Application is also related to U.S. patent application Ser. No. 14/997,160 filed on the same date as this application and entitled "Quartz Magnetometer having a Quartz Resonant Plate with a Broaden Distal End for Enhanced Magnetic Sensitivity", the disclosure of which is hereby incorporated herein by reference.

STATEMENT REGARDING FEDERALLY SPONSORED RESEARCH OR DEVELOPMENT

None

TECHNICAL FIELD

This invention relates to magnetometry and more particularly to a FM demodulation System for a quartz magnetometer which may be constructed using Micro-Electro-Mechanical Systems (MEMS) technology.

BACKGROUND

This patent discloses an integrated system for demodulating the output of a quartz MEMS magnetometer of the type disclosed by U.S. patent application Ser. No. 14/628, 182 filed Feb. 20, 2015 noted above. The disclosed quartz MEMS magnetometer utilizes the fact that frequency modulation (FM) of the quartz thickness shear mode oscillator is proportional to the strength of an external magnetic field. As such, a system can provide information regarding the strength of an external magnetic field, and several embodiments of such a system are disclosed herein.

The object of this invention is to detect or sense magnetic fields (which is known as magnetometry), especially magnetic fields sensed by a magnetometer of the types disclosed by U.S. patent application Ser. No. 14/628,182 filed Feb. 20, 2015 and entitled "A Micro-scale Piezoelectric Resonating Magnetometer" and U.S. patent application Ser. No. 14/997, 160 filed on the same date as this application and entitled "Quartz Magnetometer having a Quartz Resonant Plate with a Broaden Distal End for Enhanced Magnetic Sensitivity".

One application of magnetometry is electronic compassing (measuring Earth's magnetic field direction for use in a compass). The advantage of the current invention is that it describes a system which can be implemented using miniature components, preferably manufactured utilizing MEMS technology and ultimately miniaturized into a single compact system integrating a MEMS die and and application-specific integrated circuit (ASIC) die containing the system electronics. This disclosed system is inherently portable with resolution limits around 50 nanoTesla (nT). Embodiments of the system utilizing closed-loop operation and/or phase-sensitive detection enable even higher detection accuracy, improving the resolution to far below 50 nT are also described herein.

BRIEF DESCRIPTION OF THE INVENTION

In one aspect the present invention provides a magnetometer which is connected with an electronic demodulator. Preferably, the electronic demodulator is coupled to sense electrodes on said magnetometer and performs a frequency demodulation of a thickness shear mode oscillation of the magnetometer at the sense electrodes on said magnetometer sensed by said electronic demodulator. Preferably, the sense electrodes of the magnetometer are coupled to an interface or sustaining circuit which in turn is coupled at an output thereof to the electronic demodulator which preferably includes a phase locked loop circuit.

In another aspect the present invention provides a FM demodulator circuit for use with a magnetometer and an interface circuit combination, the magnetometer having opposing thickness shear sense electrodes coupled to said sustaining or interface circuit, the sustaining or interface circuit generating a signal having a carrier and two magnetically-sensitive sidebands in response to the a magnetic field interacting with said magnetometer, the FM demodulator circuit comprising a phased locked loop circuit coupled to an output of said sustaining or interface circuit for extracting a pure tone from a signal at the output of said sustaining or interface circuit, the pure tone corresponding to to said carrier at the output of said sustaining or interface circuit; and a down mixer having first and second inputs, the first input of down mixer being coupled to phase locked loop circuit and the second input of said of down mixer being coupled to the output of said interface or sustaining circuit for down converting the magnetically-sensitive sidebands to baseband frequencies without said carrier.

In yet another aspect the present invention provides a magnetometer system which includes a magnetometer, an interface circuit and an electronic demodulator. The interface circuit is coupled to sense electrodes disposed on the magnetometer and the demodulator being coupled to the interface circuit.

DETAILED DESCRIPTION

Figure 1A:
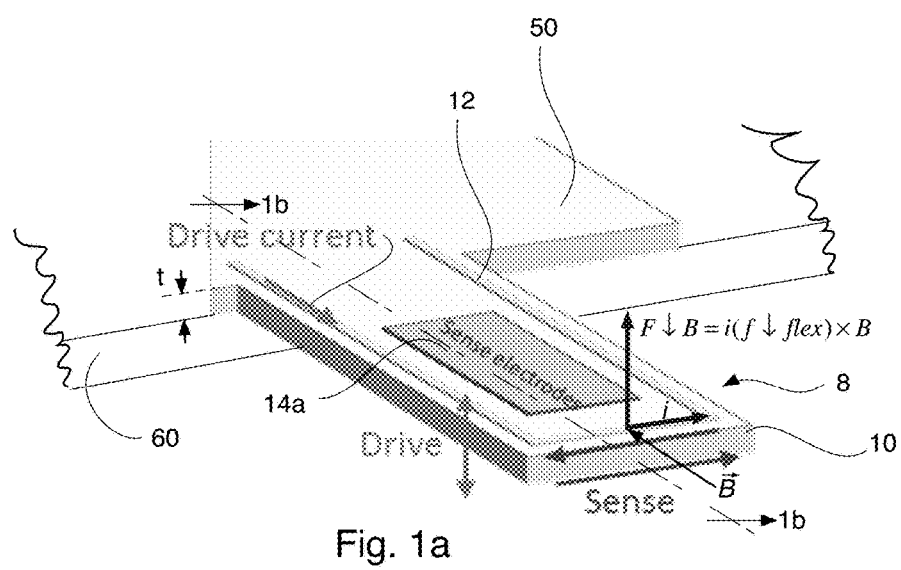
FIGS. 1a-1d show the general principles of the quartz MEMS-manufacturable magnetometer taught by U.S. patent application Ser. No. 14/628,182 referenced above, with FIG. 1a being a perspective view of the magnetometer, FIG. 1b being a section view therethrough taken along line 1b-1b of FIG. 1a, FIG. 1c being a schematic diagram of a sustaining or interface circuit coupled to the magnetometer and FIG. 1d depicting the FM sidebands in the output of the sustaining or interface circuit generated in response to a magnetic field interacting with the magnetometer.
Figure 1B:
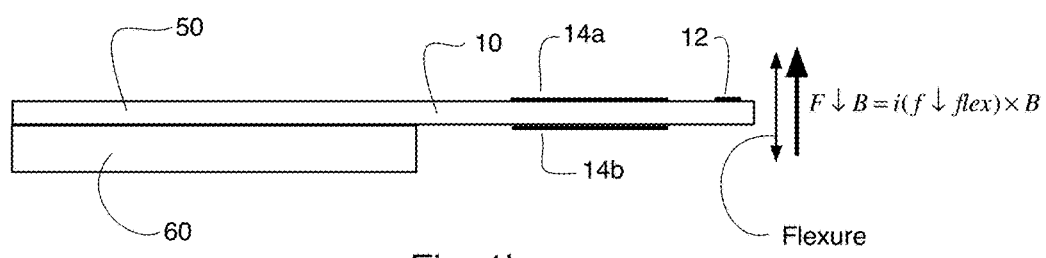
Figure 1C:
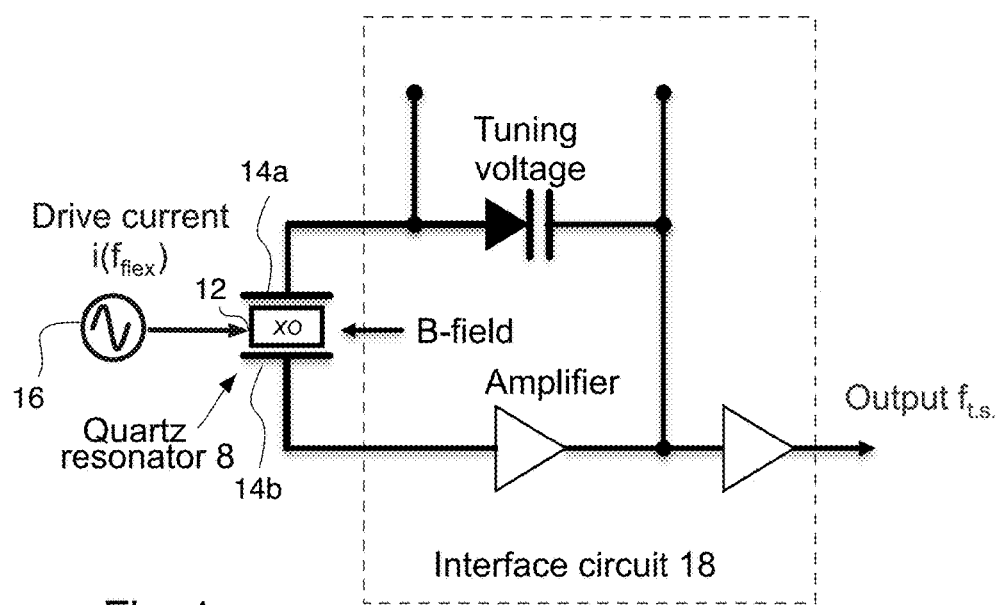

FIGS. 1a-1d depict the general principles of the Quartz MEMS magnetometer 8 taught by U.S. patent application Ser. No. 14/628,182 filed Feb. 20, 2015 and entitled "A Micro-scale Piezoelectric Resonating Magnetometer" which is referenced above. As is depicted by FIG. 1a, the quartz micro-resonator has a quartz cantilever 10 which is preferably fixed (thus clamped) at one end of same where it is preferably integrally connected to a wider quartz base portion 50 which in turn may be directly anchored or coupled to a substrate 60 which may be made of silicon, for example, and thus comprise a semiconductor substrate with circuitry formed therein. The fabrication of the quartz resonant magnetometer depicted in FIG. 1a preferably mirrors the apparatus and MEMS process that is described in the U.S. patent "Integrated quartz oscillator on an active electronic substrate," U.S. Pat. No. 7,830,074, but with additional metal disposed along the two parallel side edges and along the tip of the quartz cantilever 10 thereby forming an electrically conductive loop 12. When a current is passed around the loop 12 disposed at (or near) the edges of the quartz resonator plate 10 (generated by a drive current source 16 at a frequency $f_{flex}$) a Lorentz force $\vec{F_B}$ is generated in the out-of-plane direction if an external magnetic field $\vec{B}$ is present with a component along the length of a major axis of the resonator plate 10. This out-of-plane force $\vec{F_B}$ will drive a flexural vibration mode of the quartz plate 10 (see FIG. 1b where the flexure or flexural mode is identified), resulting in periodic straining of the thickness-shear region of the quartz plate 10 preferably near where the cantilevered quartz plate 10 mates with the wider quartz base portion 50. Note FIG. 7. The thickness shear region of the quartz plate is defined by the location of the electrodes 14a and 14b in FIG. 7. The flexure mode of oscillation is depicted by the two headed arrow in FIG. 1b (and also by the two headed arrow in FIG. 1a adjacent the word "Drive") while the thickness shear mode of vibration is identified by the two parallel arrows adjacent the word "Sense" in FIG. 1a. The periodic straining in aforementioned region, which supports the typical high frequency quartz thickness shear acoustic resonance mode, generates frequency-modulated (FM) sidebands $f_{flex}$ (see the graph of FIG. 1d) on either side of the thickness shear resonance frequency $f_{t.s.}$ when the quartz thickness shear mode is driven into oscillation using an interface circuit 18.

Figure 4:
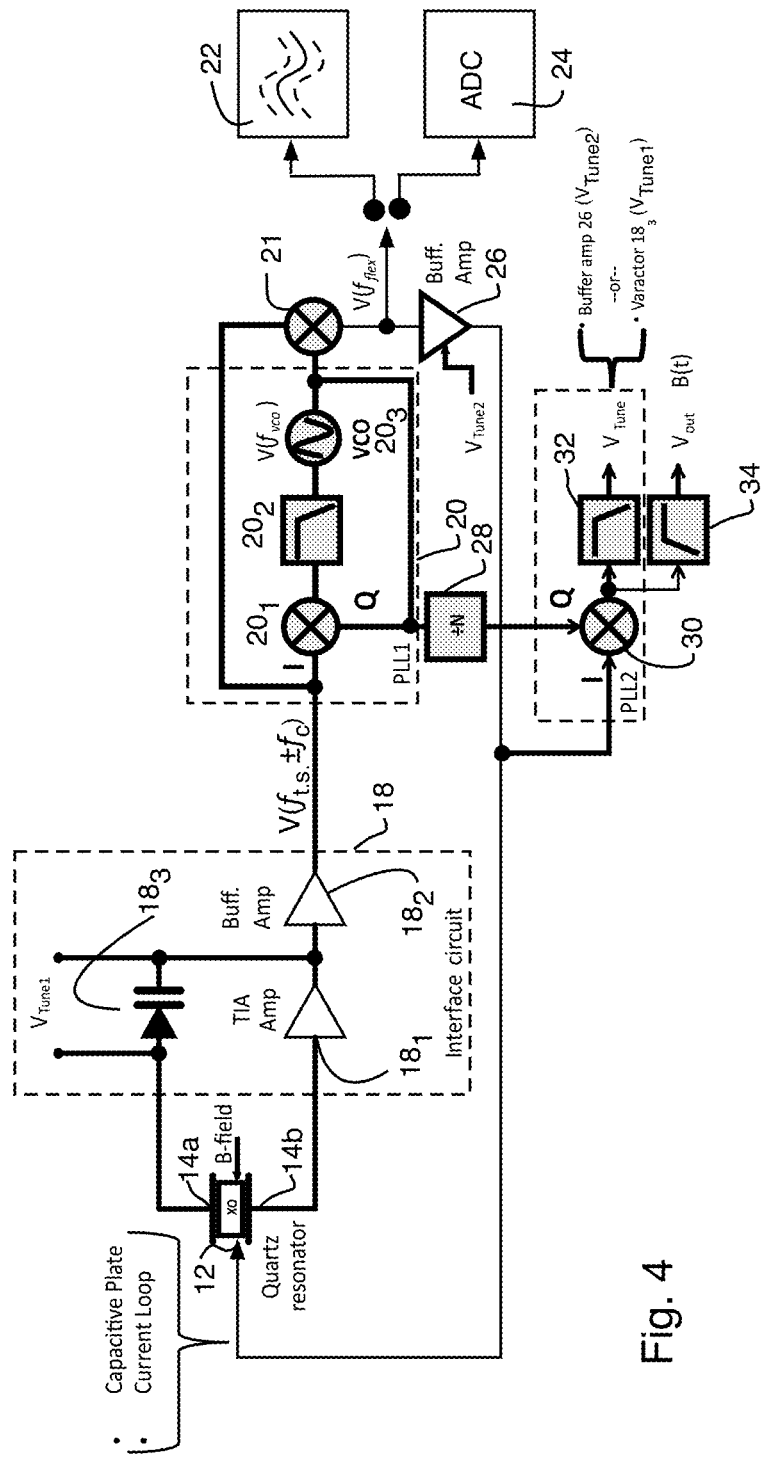
FIG. 4 depicts one embodiment of a circuit for implementing an analog system for implementing closed-loop phase sensitive detection of magnetic field $\vec{B}$.
Figure 4A:
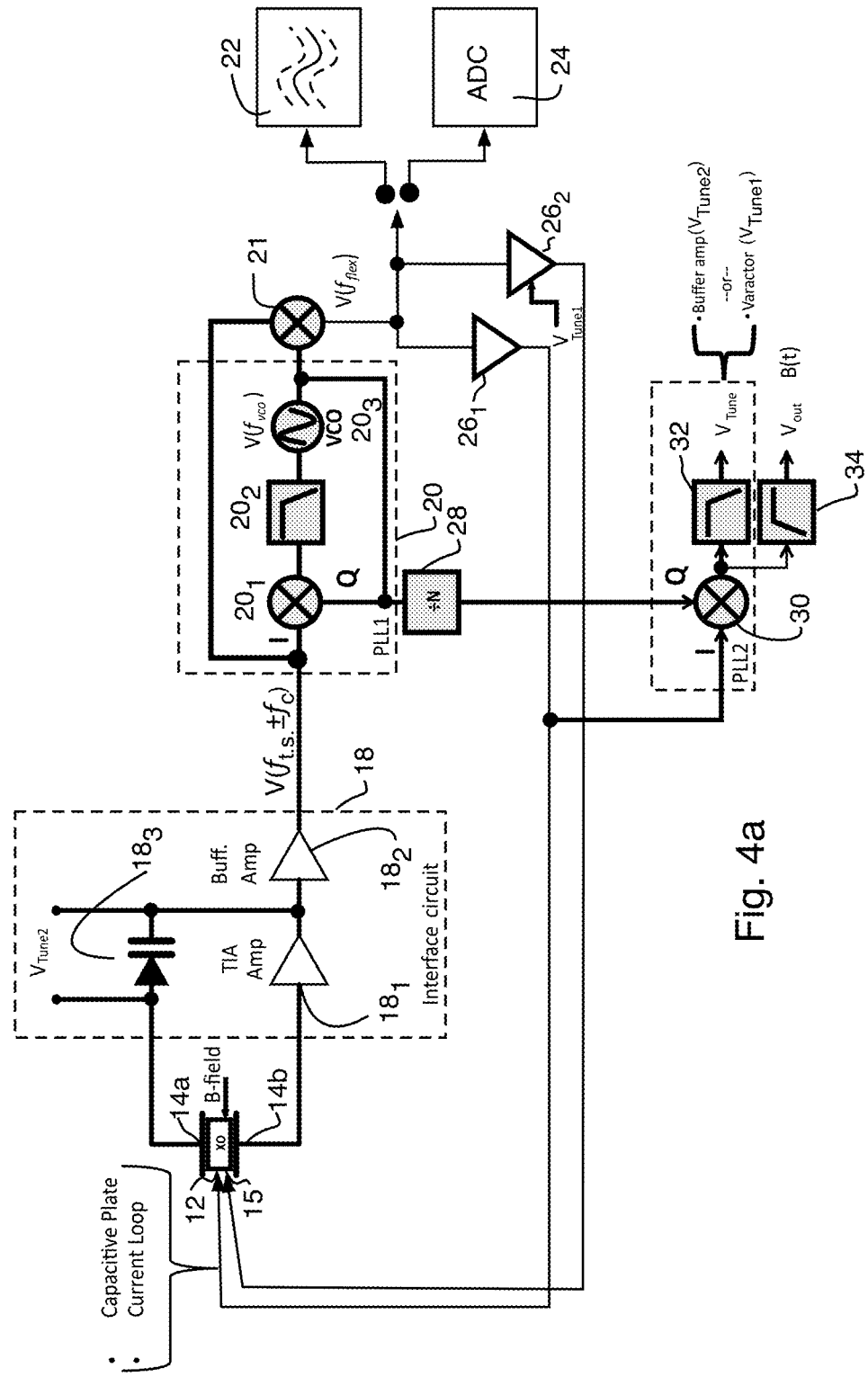
FIG. 4a depicts another embodiment of a circuit for implementing an analog system for implementing closed-loop phase sensitive detection of magnetic field $\vec{B}$.
Figure 5:
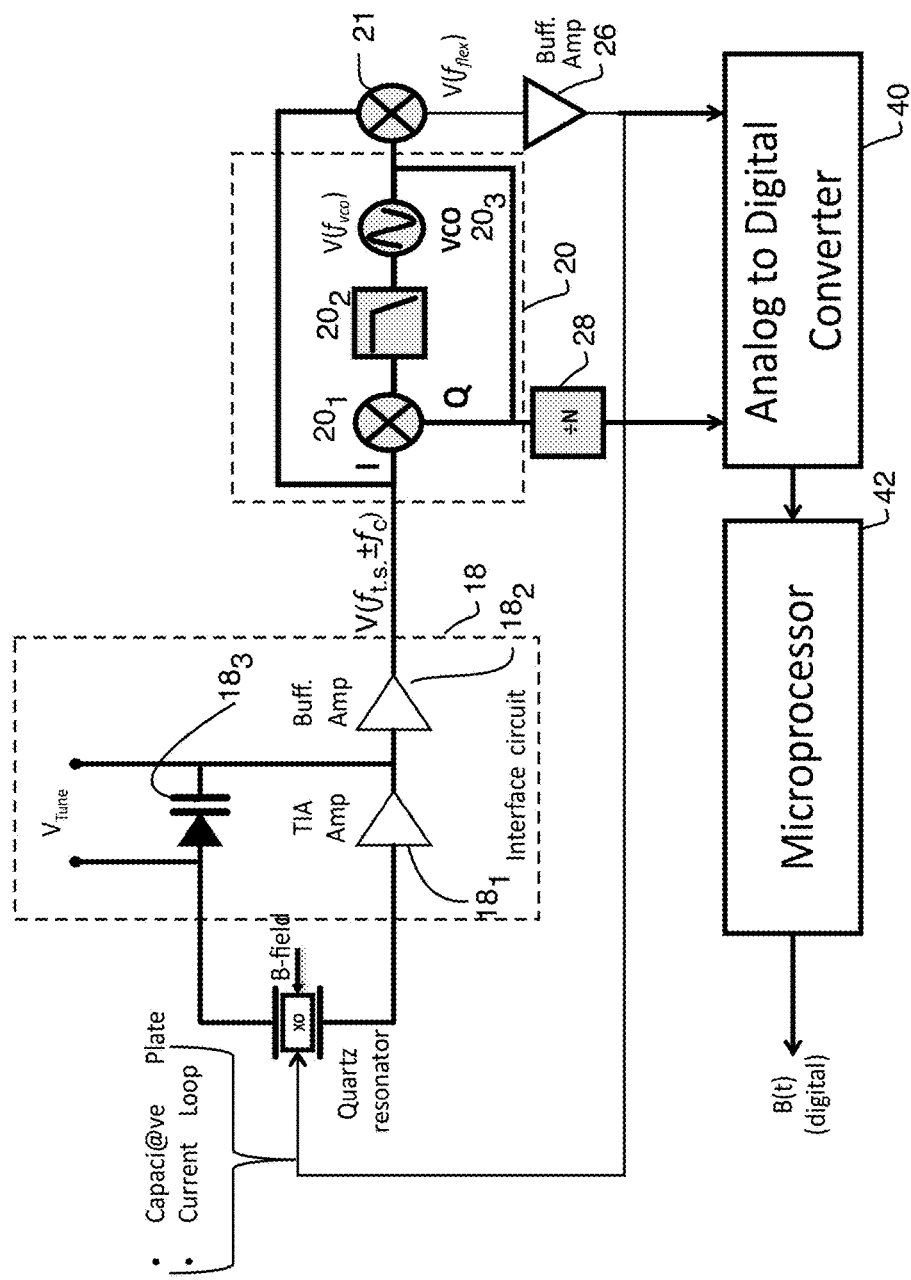
FIG. 5 depicts an embodiment of a circuit for implementing a digital system for implementing closed-loop phase sensitive detection of magnetic field $\vec{B}$.

There are two distinct oscillation loops in this system. The first is formed by the thickness shear mode of the quartz plate 10 in combination with the interface circuit 18 and this oscillator operates at a high frequency (~10 MHz to 10 GHz depending on application requirements). The second is formed by the flexural mode of the quartz plate 10 in combination with feedback provided by a demodulation circuit output at mixer 21 (500 Hz to 1 MHz depending on the flexural mode frequency). When discussing "open loop" and "closed loop" operation herein, reference is being made to the flexural mode oscillation loop, not the thickness shear oscillation loop, which should preferably be understood to be a closed loop oscillation circuit. In "open loop" operation, the current loop 12 or capacitive plates 15 (if used) need to be driven by some external source 16 near the flexural mode frequency of quartz plate 10 to excite the quartz plate 10 into that mode of oscillation. In "closed loop" operation, the current loop 12 is driven by the output of a demodulation circuit at mixer 21 as shown in the embodiments of FIGS. 4, 4a and 5.

The amplitude of the sidebands (see FIG. 1d) at $f_{flex}$ is proportional to the sensed magnetic field component while $f_{t.s.}$ is the fundamental oscillatory frequency in thickness shear mode of the cantilevered beam 10.

Figure 2:
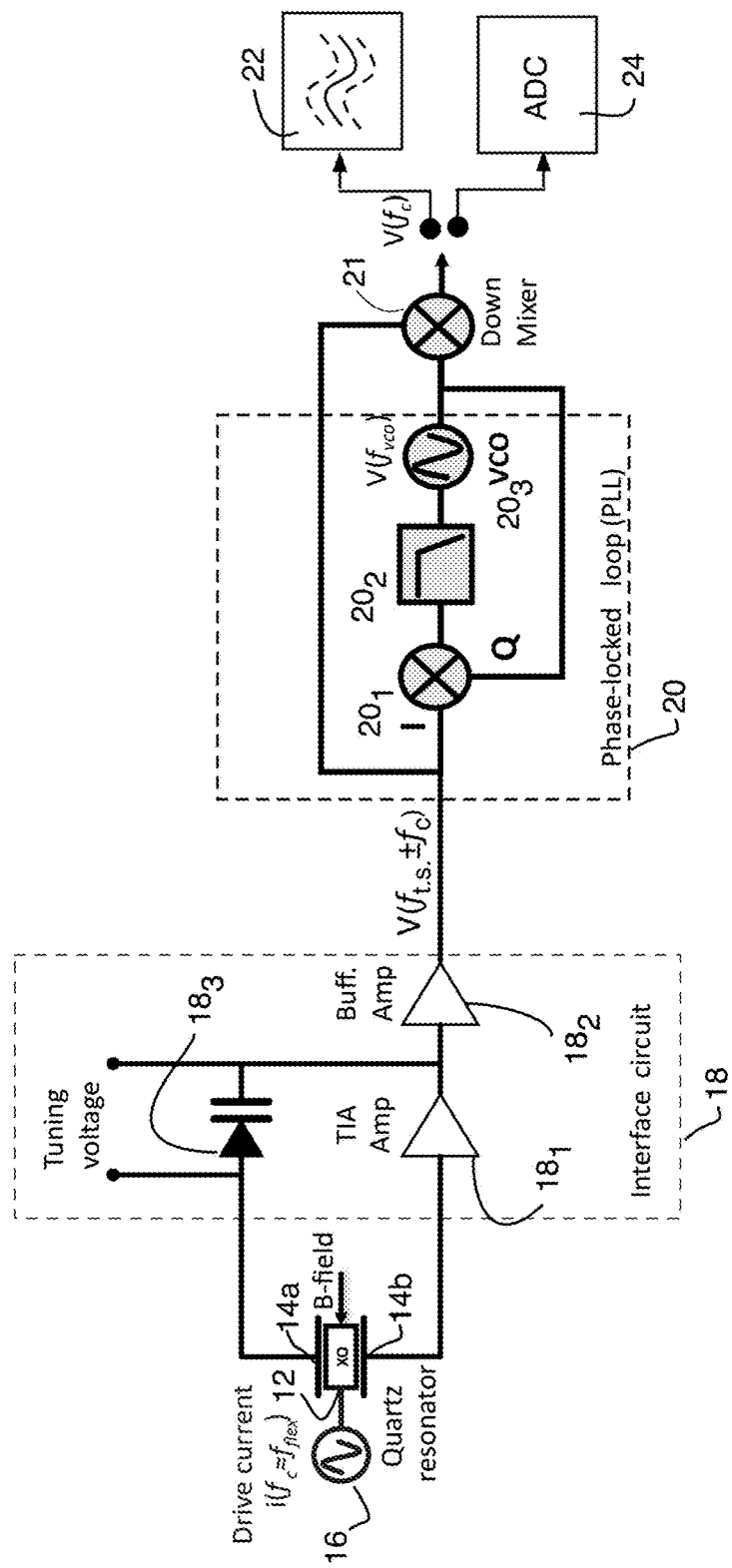
FIG. 2 depicts an open-loop system which is capable of demodulating the FM magnetometer signal.

Since the thickness shear frequency is typically in the tens of MHz to several GHz region, recording the amplitude in a portable device of the sidebands calls for FM demodulating above output signal (the interface circuit 18) to a frequency at which a high resolution analog-to-digital converter (ADC) can accurately digitize the signal. FIG. 2 shows one possible embodiment of a system that can demodulate the magnetometer signal. This system is operates in open loop, because no feedback is provided to the current generator 16 driving the metal loop 12 to hold the loop current at the flexural resonance frequency ($f_{flex}$) of the quartz plate 10. How such an open loop system can be constructed from commercial-off-the-shelf (COTS) electronic components will now be described and thereafter closing the loop (that is, convert it to a closed loop system) will be discussed along with phase-sensitive detection, which potentially improves the ultimate resolution of the magnetometer 8 by maintaining a frequency lock onto the flexural resonance of the quartz plate 10.

Figure 1D:
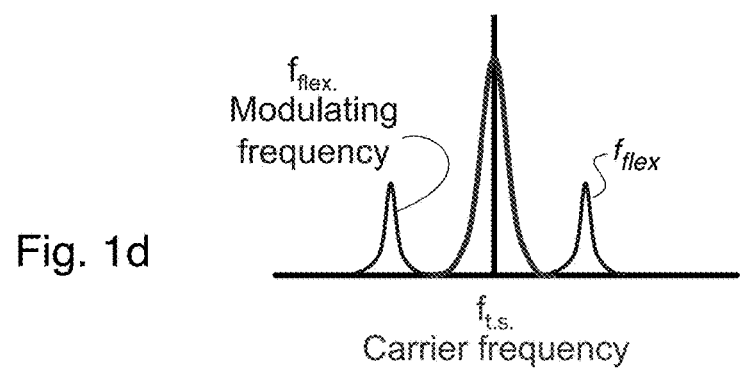

The system should provide a current to loop 12 having a frequency near the flexural resonance mode of the quartz resonator plate 10 as well as demodulate the thickness-shear oscillation signal to extract the magnetic field signal from the resulting FM sidebands depicted by FIG. 1d. In order to be "near" the flexural resonance mode of the quartz resonator plate 10, the frequency of the current in the loop 12 should preferably fall in the range of $f_{flex} \cdot (1-1/Q)$ to $f_{flex} \cdot (1+1/Q)$, where Q is the quality factor of the flexural resonance mode. Also, modifications to the system are suggested which will enable closed loop operation of the thickness-shear oscillator as well as forming an oscillation loop around the flexural mode of the quartz resonator 8. The closed-loop embodiments of the system (see FIGS. 4 and 5) enable phase-sensitive detection of the magnetic field perturbations, which will greatly enhance the sensitivity and resolution of the quartz magnetometer 8. But before getting to the details of the closed loop embodiments, let us first discuss the open loop embodiment of FIG. 2.

FIG. 2 depicts an embodiment of an open-loop system which is capable of demodulating the FM magnetometer signal provided by the quartz magnetometer 8 (at the output of the sustaining or interface circuit 18) and bring (demodulate) the magnetically-sensitive sidebands back to their native flexural mode frequency (which is low enough in frequency for a high resolution ADC to accurately capture) by the mixer subtracting the thickness-shear carrier frequency (which is synonymous with the thickness shear resonance frequency) such that the sidebands move from $f_{ts} \pm f_c$ to simply $f_c$. A drive current provided by source 16 at a frequency $f_c$ which drives the current loop 12 of the quartz magnetometer 8 in the presence of an external magnetic field $\vec{B}$, results in sidebands on the thickness shear carrier frequency offset by multiples of the drive current frequency $f_c$. In this "open loop" operation of the flexural mode, the source 16 supplies current to the metal loop 12. The frequency of this current is not necessarily at the flexural mode resonance frequency $f_{flex}$ although it would be desirable if it were so. Anyway, that is why it is referred to as an independent frequency $f_c$ herein.

Figure 1E:
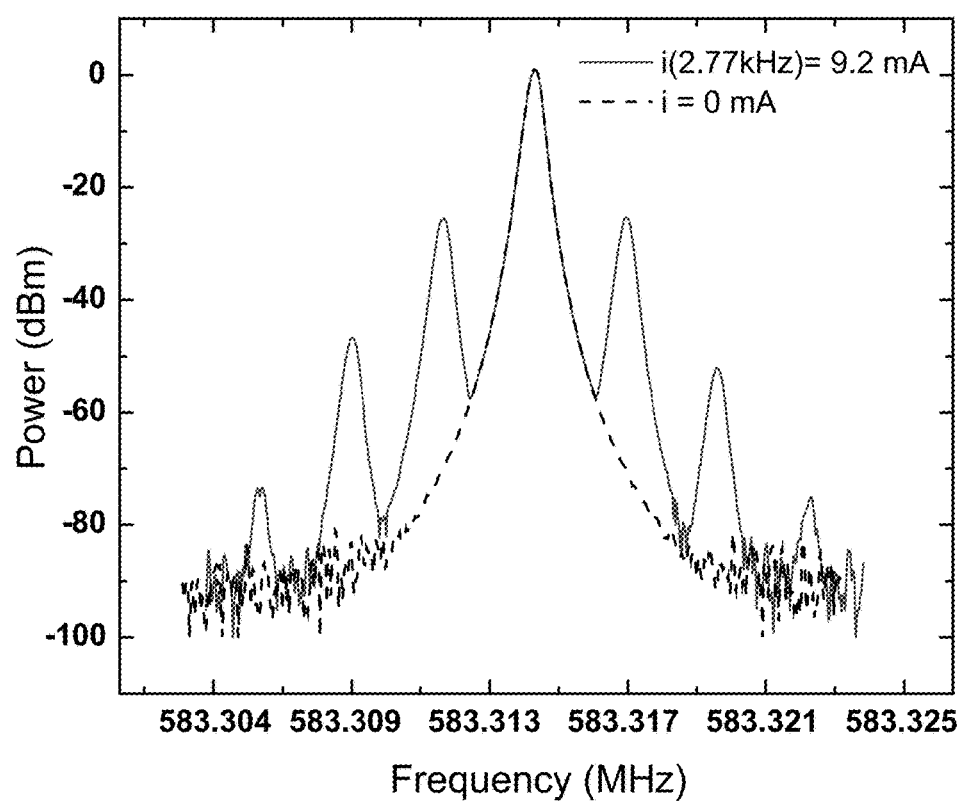
FIG. 1e is a graph of the output of the quartz thickness shear oscillator circuit when no AC current is applied to the current loop is 0 dBm (the dashed line) but −25 dBm FM sidebands and harmonics (solid lines) are generated when the applied DC magnetic field couples with the AC drive current at 2.77 kHz.

As is depicted by FIG. 1e, the sidebands appear at offsets of multiples of $f_c$. They only occur at offsets of $f_{flex}$, when the flexural mode is driven in closed loop, that is, when $f_c = f_{flex}$ (per the discussion above about what "near" means). In the "closed loop" operation of the flexural mode, the function of the current source 16 is replaced by the output of the demodulation circuit at mixer 21. This means that $f_c$ will always be driven toward $f_{flex}$ by the natural tendency of the flexural oscillation loop to track the flexural mode resonance frequency in a closed loop configuration. And this in turn means that the desired condition above that $f_c = f_{flex}$ can be achieved for the closed loop embodiments which will give the maximum possible magnetic sensitivity of the sidebands since it will maximize the periodic straining induced by the flexural mode on the thickness shear mode.

The quartz magnetometer 8 is coupled to an interface circuit 18 which preferably has the input of a transimpedance amplifier (TIA) $18_1$ coupled to one of the thickness shear sense electrodes 14b of the quartz magnetometer 8. The other thickness shear electrode 14a is coupled in series with an optional varactor $18_3$ to an output of TIA $18_1$. A tuning voltage is applied across the varactor $18_3$ to change its capacitance, resulting in series pulling of the thickness-shear oscillation frequency to a desired target value. The output of TIA $18_1$ is coupled to a buffer amplifier $18_2$, an output of which forms the output of the interface circuit 18 and hence the magnetically-sensitive output of the quartz magnetometer 8 system.

The output of the interface circuit 18 is fed into a phase-locked loop (PLL) 20, which is preferably formed by a mixer $20_1$, a low-pass filter $20_2$, and a voltage-controlled oscillator (VCO) $20_3$. The mixer $20_1$ acts as a phase detector between its I and Q channels. The low pass filter $20_2$ blocks high order harmonics of the down-mixed signal at its input. In this way, the output of the filter $20_2$ is proportional to the phase difference between the I and Q channels. The phase difference is scaled appropriately using, for example, a tunable gain amplifier (not shown) and fed into the tuning port of the VCO $20_3$, which either increases or decreases the frequency of the VCO $20_3$ until a lock is achieved between the VCO $20_3$ and the incoming signal from the sustaining or interface circuit 18. Hence, the frequency of the VCO $20_3$ tracks the thickness-shear frequency of the magnetometer 8, but the output of the VCO $20_3$ is free of sidebands. Now the single-tone output of the VCO $20_3$ and the magnetometer signal output from the sustaining or interface circuit 18 are mixed together at a down mixer 21, which results in frequency subtraction and brings the sidebands to their native frequency near $f_{flex}$. A bandpass filter 22 can optionally be used to remove both DC and higher order modulation products from $V(f_c)$ output by the mixer 21, or the signal $V(f_c)$ can be fed into an analog-digital converter (ADC) 24 and the sideband amplitude can be extracted digitally to obtain a measurement of the strength of the magnetic field sensed by the magnetometer 8.

Figure 3:
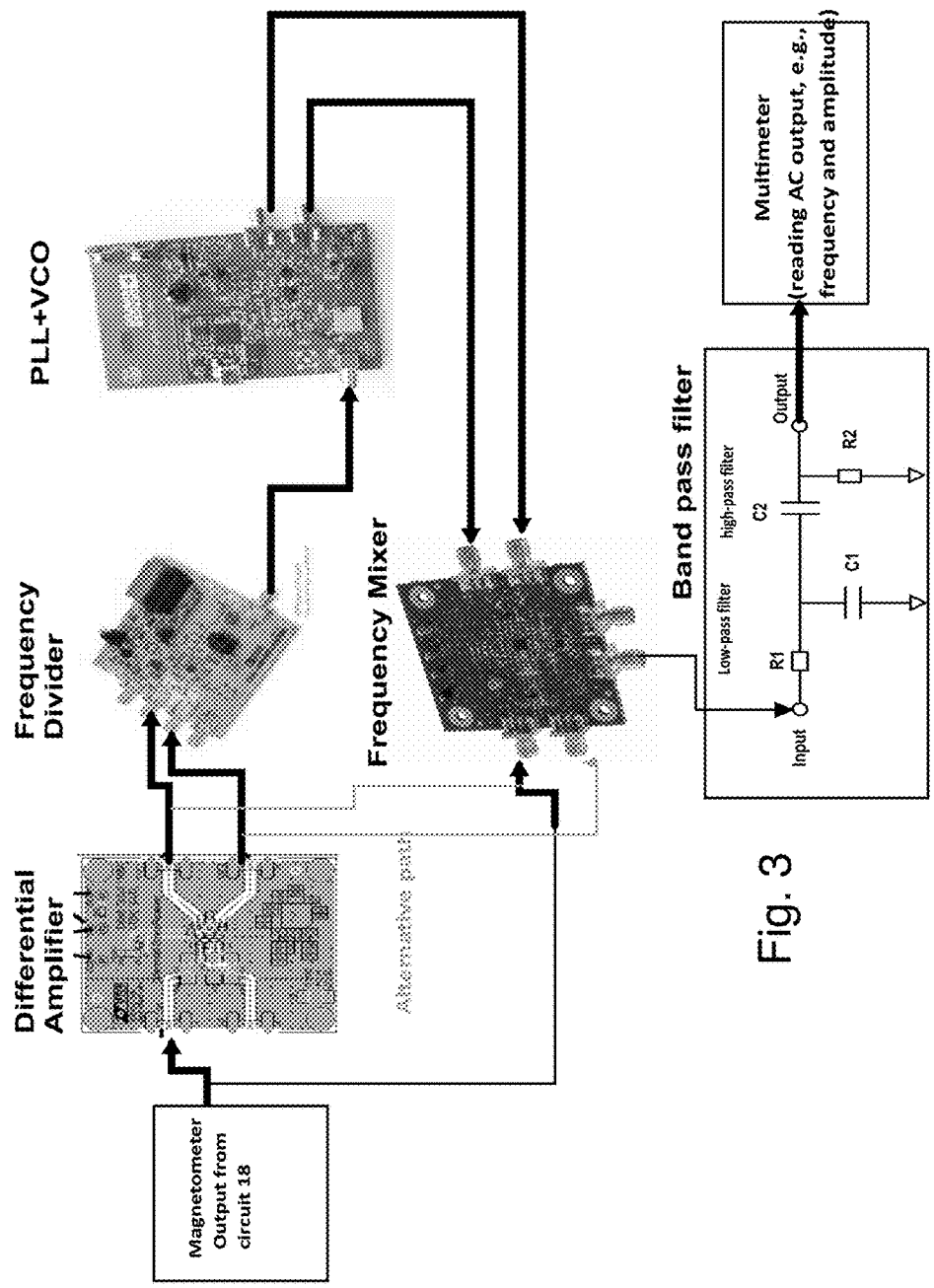
FIG. 3 depicts a COTS implementation of the FM demodulation system of FIG. 2.

FIG. 3 depicts a COTS implementation of the FM demodulation system of FIG. 2. First, a differential amplifier (Linear Technologies LT6411) is used to convert the single-ended magnetometer output from sustaining circuit 18 to a differential signal in order to drive the COTS PLL and frequency mixers/dividers. A frequency divider (Analog Devices ADF4007) is used to downconvert the magnetometer signal to a frequency the COTS PLL+VCO (Analog Devices ADF4360-7) can handle (in this implementation, a 600 MHz signal was divided by 8 to 75 MHz for the PLL reference input—note that the division and subsequent multiplication by 8 is an artifact of the specific PLLs used in this implementation. If a different PLL is used (for example, in the case that the thickness shear frequency is changed), this division and multiplication by 8 may not be necessary). Then, the PLL+VCO is used to lock on to the divided magnetometer output signal and generates an output multiplied up by 8 so that it is back at the native thickness shear frequency (again 600 MHz). However, the VCO output is a pure tone without the magnetometer side bands. Finally, the PLL signal and the magnetometer signal are mixed together with a frequency mixer (Analog Devices ADL5801), which is then band-pass filtered and fed to an AC multimeter, or optionally digitized by an ADC.

Figure 6:
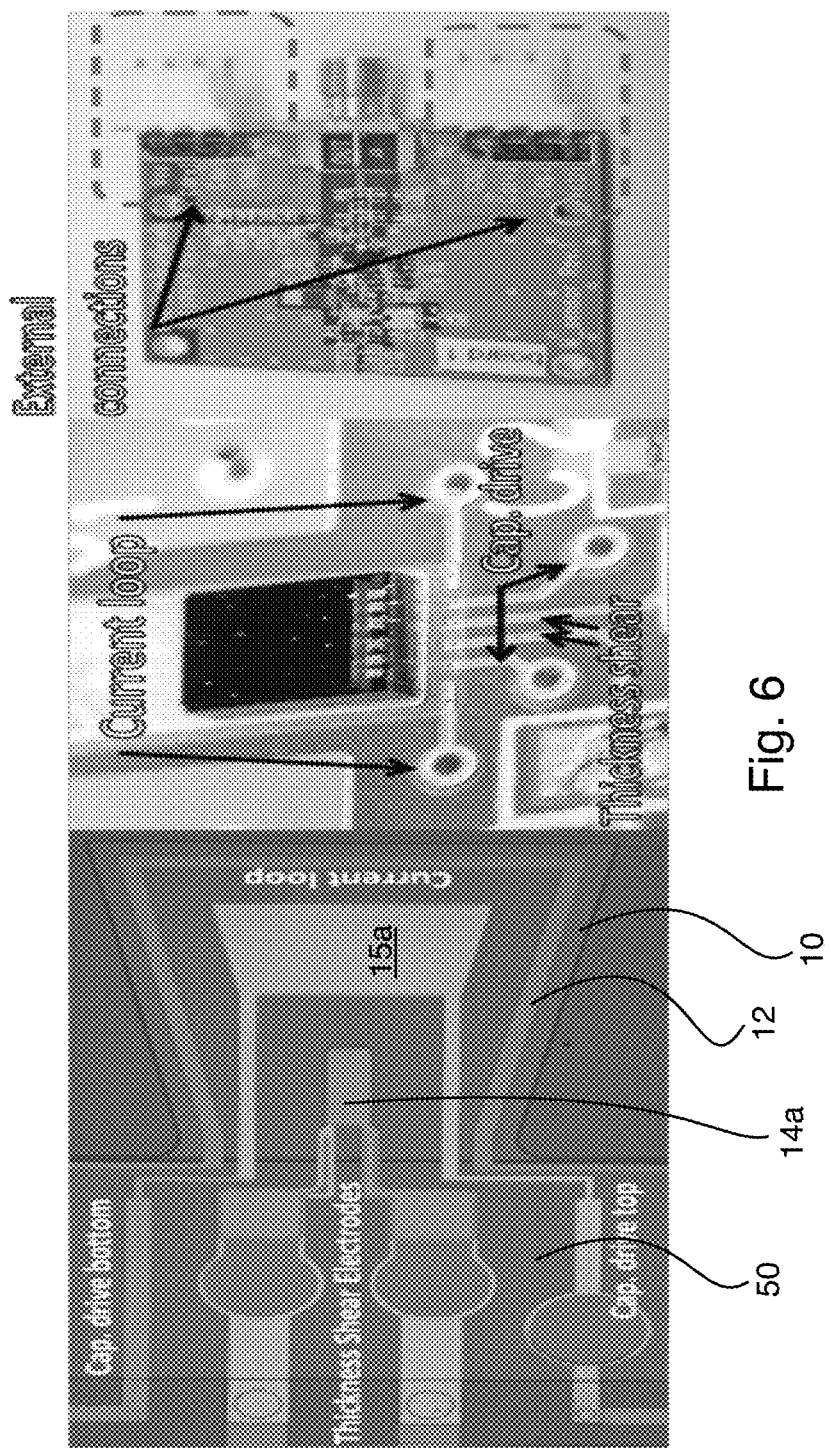
FIG. 6. depicts, on its left hand side a Quartz MEMS magnetometer incorporating capacitive drive electrodes, and also depicts a wafer-level packaged (WLP) Quartz MEMS magnetometer die mounted on a printed-circuit board (PCB) and electrically connected with wire bonds (middle photograph). On the right is the entire Quartz magnetometer PCB showing high frequency output port at the thickness shear carrier frequency (labeled OUT) as well as low-frequency external connections for power supply, current loop control (Cdrv1/2), capacitive plate control (Cap1/2), and thickness shear frequency tuning (Vctrl).
Figure 7:
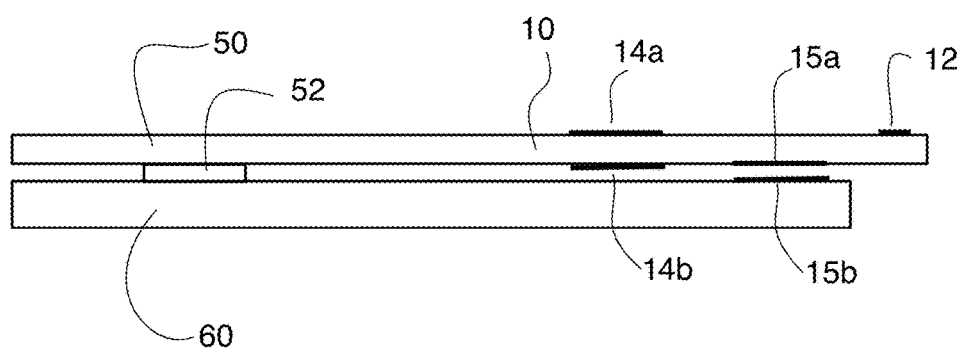
FIG. 7 is a side elevation view similar to FIG. 1b, but FIG. 7 also shows the optional capacitive plates.

To maintain maximum sensitivity, it is important for the magnetometer 8 to track the resonance frequency of the flexural mode of the quartz plate 10. This can be achieved by closing the loop between the FM demodulated output from the down-mixed (and optionally filtered) output of the mixer 21 and the current loop 12 drive signal. See the closed loop embodiments of FIGS. 4 and 5. Closed-loop operation will be able to maintain maximum sensitivity over a defined temperature range and will also enables phase-sensitive detection of the magnetometer signal, resulting in improved resolution compared to over open-loop amplitude detection utilized in the embodiments of FIGS. 2 and 3. Hence, a closed-loop quartz magnetometer 8 system will be environmentally robust while maintaining maximum performance. However, in the event that there is no external magnetic field, no Lorentz force can be generated to drive the flexural mode of magnetometer 8 into oscillation. A solution to this problem is to use capacitive driving plates 15a and 15b as shown by FIGS. 6 and 7 and in FIG. 3 of U.S. Pat. No. 8,569,937. Plate 15a is disposed on beam 10 (preferably interiorly of loop 12) while plate 15b is disposed on adjacent fixed structure (fixed relative to the plate 10 which vibrates) such as substrate 60 (see also FIG. 1). By driving the beam 10 into flexural oscillation with capacitive drive plates 15, a force can always be generated, even in the absence of an external magnetic field $\vec{B}$. Now the external magnetic field $\vec{B}$ will contribute small perturbations on top of the capacitively-driven flexural mode sidebands seen on the thickness-shear oscillation of FIG. 1. These magnetic field perturbations will induce phase variations proportional to the external magnetic field, which can be read out with the systems shown in FIGS. 4 and 5.

FIG. 4 depicts a embodiment for implementing an analog system for implementing closed-loop phase sensitive detection of magnetic field $\vec{B}$. The output of the FM demodulated sidebands from mixer 21 are buffered by a buffer amplifier 26 and fed back to the capacitive drive plates 15. One of the plates 15a or 15b is grounded while the other one of the plates 15a or 15b receives the signal from the buffer amp 26 as well as the current loop 12. The current loop 12 is connected in parallel with the plates 15a & 15b in the embodiment of FIG. 4, but the current loop 12 could alternatively be connected in series with the plates 15a & 15b. The buffer amp 26 may be understood to also provide a DC offset voltage to the AC demodulated signal in order to drive the capacitive plate actuator 15. Hence, in a practical implementation (see FIG. 4a), there are two buffer amplifiers $26_1$ and $26_2$: one ($26_2$) for driving the capacitive plate actuator 15 (with DC offset) and another ($26_1$) to drive the current loop 12 (which does not require a DC offset to function).

FIGS. 4 and 4a show a signal $V_{tune}$ output from low pass filter 32 being applied to the Buff Amp. 26 (as signal $V_{tune2}$) which is preferred over applying $V_{tune}$ to varactor $18_3$ (as signal $V_{tune1}$). The preferred implementation is to route the tuning signal $V_{tune}$ to buffer amp 26 (if optional capacitive plates 15a/b are utilized with the embodiment of FIG. 4) or $26_2$ (for the embodiment of FIG. 4a) to adjust the DC level provided by buffer amp $26_2$ to the capacitive plates 15a/b which would tune the flexural mode resonance frequency. If $V_{tune}$ is routed to the varactor 183, then the thickness shear resonance frequency is tuned, but that is less preferred, but may still achieve the goal of making the flexural resonance frequency a specific division ratio (N) of the thickness shear resonance frequency. It may be possible to route "$V_{tune}$" to both the varactor $18_3$ and buffer amp 26 or $26_2$ if stability is not adversely impacted thereby. Otherwise, $V_{tune1}$ or $V_{tune2}$, whichever one is not connected to $V_{tune}$ may be connected to a DC voltage when the optional capacitive plates 15 are utilized.

This closes the loop for the flexural mode oscillator and enables sustained oscillation at $f_c=f_{flex}$ even in the absence of an external magnetic field $\vec{B}$ (using the capacitive driver plates 15). Note that there are two oscillators in the system, one at the flexural frequency and one at the thickness shear frequency of the magnetometer 8. A small magnetic field change will perturb the phase of the flexural mode oscillator, which can be read out relative to the stable thickness shear frequency when divided appropriately by divider 28. To simplify this division, the thickness shear frequency can be tuned to a multiple of the flexural frequency by providing a second phase-locked loop (PLL2) formed by a mixer 30, a low pass filter 32, and one of the vibration modes of the quartz magnetometer 8. Which vibration mode depends on where $V_{tune}$ is connected. If $V_{tune}$ is connected to buffer $26_2$, this refers to the flexural mode. If $V_{tune}$ is connected to varactor $18_3$, this would refer to thickness shear mode. The slowly-varying DC component from low pass filter 32 can be used for the phase-lock by controlling either the DC offset of buffer amp 26 (which is the currently preferred embodiment) to tune the flexural resonance frequency of the quartz plate or by controlling the tuning voltage on varactor $18_3$ to adjust the thickness shear resonance frequency, while the higher frequency components will be proportional to the magnetic field signal. Hence, low pass (see element 32) and high pass (see element 34) filters (to block the high order demodulation products) can be used to frequency discriminate the desired phase signal proportional to magnetic field strength from the slowly-varying frequency difference between the oscillators required to maintain phase lock.

FIG. 5 depicts a circuit for implementing a digital closed-loop system for implementing closed-loop phase sensitive detection of magnetic field $\vec{B}$. The flexural mode and thickness shear mode oscillators are set up in closed loop as described above with reference to FIG. 4. However, in this digital embodiment, the outputs from the buffer amplifier 26 and optionally the divider 28 are directly passed to an ADC 40 and then to a microprocessor 42, where the desired signal processing is done in the digital domain. Feeding the thickness shear resonance to the ADC 32 through a divider 28 can be optionally used as a phase reference, or the divider 28 may be eliminated and a system clock can be used as the phase reference if the system clock is sufficiently stable in frequency. The divider 28 is optional if the system clock is stable enough in frequency to act as a phase reference. If not, then the thickness shear resonance may be used instead (with the divider 28) because it is typically quite stable. As such, the divider 28 depicted in the embodiments of FIGS. 4 and 4a may be omitted and a system clock used instead, if the system clock is sufficiently stable in frequency to act as a phase reference, as the Q input to the mixer 30 in the second phase locked loop PLL2.

The embodiment of FIG. 5 can also be modified to utilize two buffer amplifiers $26_1$ and $26_2$ with separate connections to loop and capacitive electrodes of the magnetometer 8 as done in the embodiment of FIG. 4a.

FIG. 6 depicts on its left hand side a quartz magnetometer 8 incorporating capacitive drive electrodes 15a and 15b (capacitive drive electrode 15a is on the bottom side of the quartz plate in FIG. 6—see FIG. 7—while capacitive drive electrode 15b is preferably disposed on substrate 60), a current loop 12, and thickness shear electrodes 14 in a single wafer level packaged device. The device may be subsequently die-attached to a substrate 60 (using a pedestal 52 if needed—see FIG. 7—to support the device above the substrate 60) and electrical connections may be made thereto via wirebonds. The external control signals are made with the indicated connectors. Ultimately, the entire electrical system can be implemented on a single application-specific integrated circuit (ASIC), eliminating a majority of the PCB boards in the COTS implementation of FIG. 3.

Obtaining a signal proportional to the strength of magnetic field will now be discussed with reference primarily the "closed loop" implementation depicted in FIG. 4. There are several techniques to obtain a signal output proportional to the magnetic field. One technique takes the output $V(f_{flex})$ of down mixer 21 and bandpass filters that signal centered at $f_{flex}$ by filter 22 and then measures its AC amplitude or digitizes the signal $V(f_{flex})$ in an ADC 23 and performs the required filtering and/or signal conditioning in the digital domain. This is the same technique used for the closed loop embodiment of FIG. 2, except that the output of the mixer is $V(f_c)$ instead of $V(f_{flex})$.

A second technique, which is appropriate for AC magnetic fields, is to take the system output signal proportional to the magnetic field strength as the output of high pass filter 34. Since the output of mixer 30 is proportional to the phase difference between its I and Q, this technique should allow for very sensitive phase-based detection of the time-varying components of magnetic field.

A third technique based on FIG. 4, but which would require additional hardware, is to insert an IQ generator (generating in-phase and quadrature versions of the output of divider 28) between divider 28 and mixer 30. Then an additional mixer can be placed similarly to mixer 30, but connected to the I channel of theadded IQ generator. In this way, the DC component of the external magnetic field can be measured.

The three techniques discussed above with reference to FIG. 4 could alternatively be used with the embodiment of FIG. 4a. Also, three techniques discussed above with reference to FIG. 4 could alternatively be carried out in the digital domain using the processor of FIG. 5 as opposed to utilizing the discrete electronics discussed with reference to FIG. 4.

It will be noted that the embodiment of FIG. 6 utilizes a trapezoidally shaped active area quartz magnetometer 8 as that taught by U.S. patent application Ser. No. 14/997,160 filed on the same date as this application and entitled "Quartz Magnetometer having a Quartz Resonant Plate with a Broaden Distal End for Enhanced Magnetic Sensitivity" but modified to also include capacitive drive electrodes 15a and 15b disposed preferably interiorly of loop 14. Of course, the cantilevered portion of a magnetometer 8 according to the above just referenced U.S. Patent Application should have a broadened distal end compared to its point of connection to the quartz base portion 50, and thus the embodiment of FIG. 6 can assume other shapes including the tee shaped cantilevered arm shown in the above just referenced US Patent Application.

The foregoing Detailed Description of exemplary and possibly preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims.

No claim element herein is to be construed under the provisions of 35 U.S.C. § 112(f), unless the element is expressly recited using the phrase "means for . . . " and no method or process step herein is to be construed under those provisions unless the step, or steps, are expressly recited using the phrase "comprising the step(s) of . . . ".

What is claimed is:

1. A magnetometer in combination with an interface and electronic demodulator circuits and an oscillator circuit, the oscillator circuit driving the magnetometer into a flexure mode of vibration, the magnetometer also entering a thickness shear mode of vibration in response to a sensed magnetic field while in said flexure mode of vibration, the thickness shear mode of vibration being detected by said interface and electronic demodulator circuits, the interface and electronic demodulator circuits detecting sidebands in said thickness shear mode of vibration the amplitudes of which are indicative of an intensity of the magnetic field.

2. A magnetometer in combination with an electronic demodulator wherein the electronic demodulator is coupled to sense electrodes on said magnetometer and performs frequency demodulation of a thickness shear mode of vibration of said magnetometer at said sense electrodes on said magnetometer as sensed by said sense electrodes in combination with said electronic demodulator and detects sidebands in the thickness shear mode of vibration, the sidebands having information indicative of an intensity of a sensed magnetic field.

3. The combination of claim 2 wherein said sense electrodes of magnetometer are coupled to an interface or sustaining circuit which in turn is coupled at an output thereof to said electronic demodulator.

4. The combination of claim 3 wherein said electronic demodulator includes a phase locked loop circuit.

5. The combination of claim 4 wherein said phase locked loop circuit includes a voltage controlled oscillator which is frequency locked to a carrier frequency of the shear mode of vibration of said magnetometer and generates a pure tone corresponding to said carrier frequency free of magnetically-sensitive sidebands in a signal output at the output of said interface or sustaining circuit.

6. The combination of claim 5 wherein further including a down mixer having first and second inputs, the first input of down mixer being coupled to the voltage controlled oscillator of said phase locked loop circuit and the second input of said of down mixer being coupled to the output of said interface or sustaining circuit for down converting the magnetically-sensitive sidebands to a near baseband frequency, the down mixer providing a demodulated output of said electronic demodulator.

7. The combination of claim 6 wherein said magnetometer includes a loop electrode disposed thereon which surrounds at least one of said sense electrodes on said magnetometer and wherein the demodulated output of said electronic demodulator is coupled to said loop electrode.

8. The combination of claim 6 wherein said magnetometer further includes at least one capacitive drive plate disposed thereon and wherein the demodulated output of said electronic demodulator is also coupled to said capacitive drive plate for initializing flexural mode vibrations of said magnetometer in absence of a magnetic field that said magnetometer can sense.

9. The combination of claim 3 wherein a flexural mode of vibration of the magnetometer is driven into oscillation via sustained feedback from said electronic demodulator and wherein a thickness shear oscillatory mode of the magnetometer is also driven into oscillation via a sustaining amplifier in said interface or sustaining circuit.

10. The combination of claim 3 wherein the thickness shear mode vibration frequency is tuned with a phase locked loop, coupled to interface or sustaining circuit, to a multiple N of the flexural mode vibration frequency.

11. The combination of claim 10 wherein an output of the phase lock loop is applied along with an output of the interface or sustaining circuit to a down mixer which extracts magnetically-sensitive sidebands in a signal at the output of the interface or sustaining circuit at baseband frequencies.

12. The combination of claim 11 wherein the thickness shear vibration frequency output by the phase locked loop is divided down by an N divider and wherein the N-divided thickness shear oscillation frequency output by the N-divider is applied along with an output generated by the down mixer to a second phase locked loop.

13. A FM demodulator circuit for use with a magnetometer and a sustaining or interface circuit, the magnetometer having opposing thickness shear sense electrodes coupled to said sustaining or interface circuit, the sustaining or interface circuit generating a signal having a carrier and two magnetically-sensitive sidebands generated in response to the a magnetic field interacting with said magnetometer, the FM demodulator circuit comprising:
   a. phased locked loop circuit coupled to an output of said sustaining or interface circuit for extracting a pure tone from a signal at the output of said sustaining or interface circuit, the pure tone corresponding to to said carrier at the output of said sustaining or interface circuit; and
   b. a down mixer having first and second inputs, the first input of down mixer being coupled to phase locked loop circuit and the second input of said of down mixer being coupled to the output of said interface or sustaining circuit for down converting the magnetically-sensitive sidebands to baseband frequencies without said carrier.

14. A magnetometer system comprising a magnetometer, an interface circuit and an electronic demodulator, the interface circuit being coupled to sense electrodes disposed on a plate of the magnetometer, the plate having flexural and thickness shear vibratory modes, the flexural mode vibratory mode modulating the thickness shear vibratory mode thereby producing sidebands in the thickness shear vibratory mode, the magnetometer and the demodulator being coupled to the interface circuit for detecting said sidebands.

15. The magnetometer system of claim 14 wherein the magnetometer has a loop electrode which follows an outline of the shape of an active portion of the magnetometer and wherein the demodulator has an output for driving the loop electrode of the magnetometer.

16. The magnetometer system of claim 14 wherein the magnetometer wherein the plate having flexural and thickness shear vibratory modes is a quartz plate and wherein the flexural vibratory mode is driven, in use, into vibration by the demodulator and wherein the thickness shear vibratory mode is driven, in use, into vibration by the interface circuit.

17. The magnetometer system of claim 16 wherein a signal corresponding to the frequency of the flexural vibratory mode is electronically mixed in a mixer with a signal corresponding to the frequency of the thickness shear vibratory mode to produce an output signal proportional to the phase of the flexural mode oscillation which is also proportional to the strength of an external magnetic field sensed, in use, by the magnetometer.

18. The magnetometer system of claim 17 wherein frequency of the thickness shear vibratory mode frequency is tuned with a phase locked loop to a multiple of the frequency of the flexural vibratory mode.

19. The magnetometer system of claim 18 wherein a low pass filter passes a DC component of the output signal to tune the thickness shear vibratory mode frequency while a bandpass filter selects the frequency components of phase perturbations in the output signal which are proportional to the strength of the external magnetic field.

20. The magnetometer system of claim 19 wherein the output of the mixer is applied to an analog to digital converter.

21. The magnetometer system of claim 20 wherein a microprocessor is coupled to the analog to digital converter.

22. A magnetometer system for measuring the intensity of a magnetic field, the magnetometer system comprising a magnetometer and an interface circuit, the magnetometer having sense electrodes disposed on a dielectric resonator plate, the interface circuit being coupled to said sense electrodes and detecting sidebands in a thickness shear mode of vibration of said dielectric resonator plate, the sidebands having an amplitude indicative of the intensity of said magnetic field.

23. The magnetometer system of claim 22 wherein the dielectric resonator plate is a quartz resonator plate.

24. The magnetometer system of claim 23 wherein the system further has an oscillator circuit and wherein the quartz resonator plate has at least one loop electrode disposed at or near edges of the quartz resonator plate and spaced from said sense electrodes, the at least one loop electrode being driven by a drive current provided by an oscillator circuit for causing the quartz resonator plate to vibrate in a flexure mode while the quartz resonator plate is also vibrating in said thickness shear mode in the presence of said magnetic field.

25. An apparatus comprising a quartz plate, an interface circuit and an electronic demodulator, the interface circuit being coupled to sense electrodes disposed on the quartz plate, a loop electrode disposed on the quartz plate which surrounds at least one of said sense electrodes, an output of said electronic demodulator being coupled to said loop electrode, the plate having flexural and thickness shear vibratory modes, the flexural mode vibratory mode modulating the thickness shear vibratory mode thereby producing sidebands in the thickness shear vibratory mode, the demodulator being coupled to the interface circuit for detecting said sidebands.

26. The apparatus of claim 25 wherein the loop electrode which follows an outline of the shape of an active portion of the quartz plate.

27. The apparatus of claim 25 wherein the flexural vibratory mode of the quartz plate is driven, in use, into vibration by the demodulator and wherein the thickness shear vibratory mode is driven, in use, into vibration by the interface circuit.

28. The apparatus of claim 27 wherein a signal corresponding to the frequency of the flexural vibratory mode is electronically mixed in a mixer with a signal corresponding to the frequency of the thickness shear vibratory mode to produce an output signal proportional to the phase of the flexural mode oscillation which is also proportional to the strength of an external magnetic field exposed, in use, to the quartz plate.

29. The apparatus of claim 28 wherein frequency of the thickness shear vibratory mode frequency is tuned with a phase locked loop to a multiple of the frequency of the flexural vibratory mode.

30. The apparatus of claim 29 wherein a low pass filter passes a DC component of the output signal to tune the thickness shear vibratory mode frequency while a bandpass filter selects the frequency components of phase perturbations in the output signal which are proportional to the strength of the external magnetic field.

31. The apparatus of claim 30 wherein the output of the mixer is applied to an analog to digital converter.

32. The apparatus of claim 31 wherein a microprocessor is coupled to the analog to digital converter.

\* \* \* \* \*